(12) United States Patent
Sugai et al.

(10) Patent No.: US 9,113,546 B2
(45) Date of Patent: Aug. 18, 2015

(54) METHOD FOR MANUFACTURING ELECTRIC FILM BODY

(71) Applicant: Kabushiki Kaisha Nihon Micronics, Tokyo (JP)

(72) Inventors: Takayasu Sugai, Tokyo (JP); Noboru Otabe, Tokyo (JP)

(73) Assignee: KABUSHIKI KAISHA NIHON MICRONICS, Tokyo (JP)

( * ) Notice: Subject to any disclaimer, the term of this patent is extended or adjusted under 35 U.S.C. 154(b) by 0 days.

(21) Appl. No.: 14/012,311

(22) Filed: Aug. 28, 2013

(65) Prior Publication Data

US 2014/0072780 A1    Mar. 13, 2014

(30) Foreign Application Priority Data

Sep. 10, 2012    (JP) ................. 2012-198813

(51) Int. Cl.
```
B32B 3/00      (2006.01)
H05K 3/00      (2006.01)
H05K 1/16      (2006.01)
H05K 1/02      (2006.01)
H05K 3/06      (2006.01)
```
(52) U.S. Cl.
CPC ............. *H05K 3/00* (2013.01); *H05K 1/0268* (2013.01); *H05K 1/167* (2013.01); *H05K 3/06* (2013.01); *H05K 2203/1476* (2013.01); *Y10T 428/24802* (2013.01)

(58) Field of Classification Search
CPC ........ H05K 1/167; H01C 17/06; H01C 17/12; H01C 17/13; H01C 17/24
See application file for complete search history.

(56) References Cited

U.S. PATENT DOCUMENTS

| | | | |
|---|---|---|---|
| 8,240,027 B2 * | 8/2012 | Egitto et al. | ................. 29/620 |
| 2009/0178271 A1 | 7/2009 | Egitto et al. | |

FOREIGN PATENT DOCUMENTS

| | | |
|---|---|---|
| JP | 08125302 | 5/1996 |
| JP | 2003017858 | 1/2003 |
| JP | 2005094017 | 4/2005 |
| JP | 2007180096 | 7/2007 |
| TW | 430827 | 4/2001 |

OTHER PUBLICATIONS

Taiwanese Search Report dated Mar. 2, 2015, for TW 102120895.

* cited by examiner

*Primary Examiner* — Elizabeth Mulvaney
(74) *Attorney, Agent, or Firm* — Bacon & Thomas, PLLC

(57) ABSTRACT

A method for manufacturing an electric film body is made by forming a film body to have a shape in accordance with a desired electric characteristic and includes a film forming process for forming an electric film body on a board layer, an electric characteristic measuring process for measuring an electric characteristic in a surface of the electric film body formed in the film forming process, an electric film body shape setting process for setting a shape of the electric film body based on the electric characteristic measured in the electric characteristic measuring process, and an electric film body forming process for forming the electric film body formed in the shape set in the electric film body shape setting process.

7 Claims, 7 Drawing Sheets

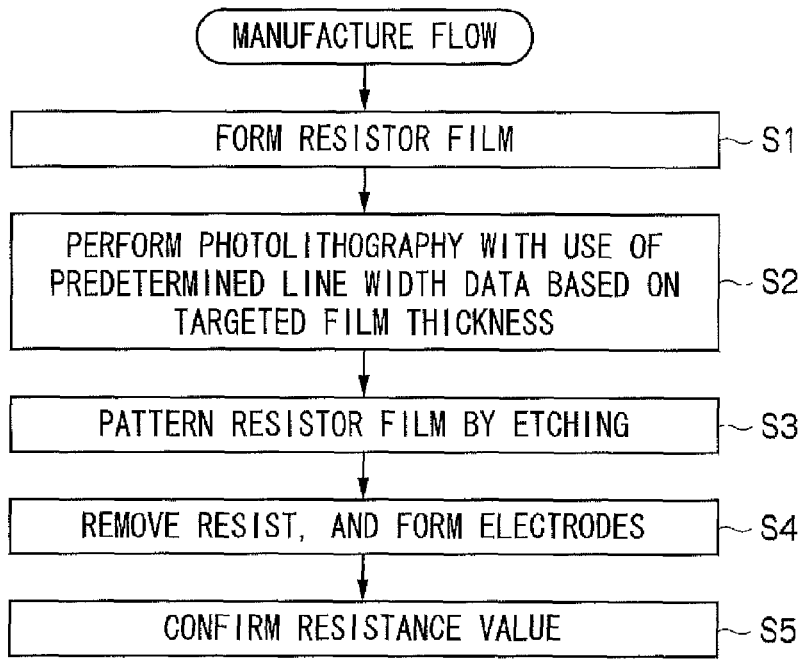
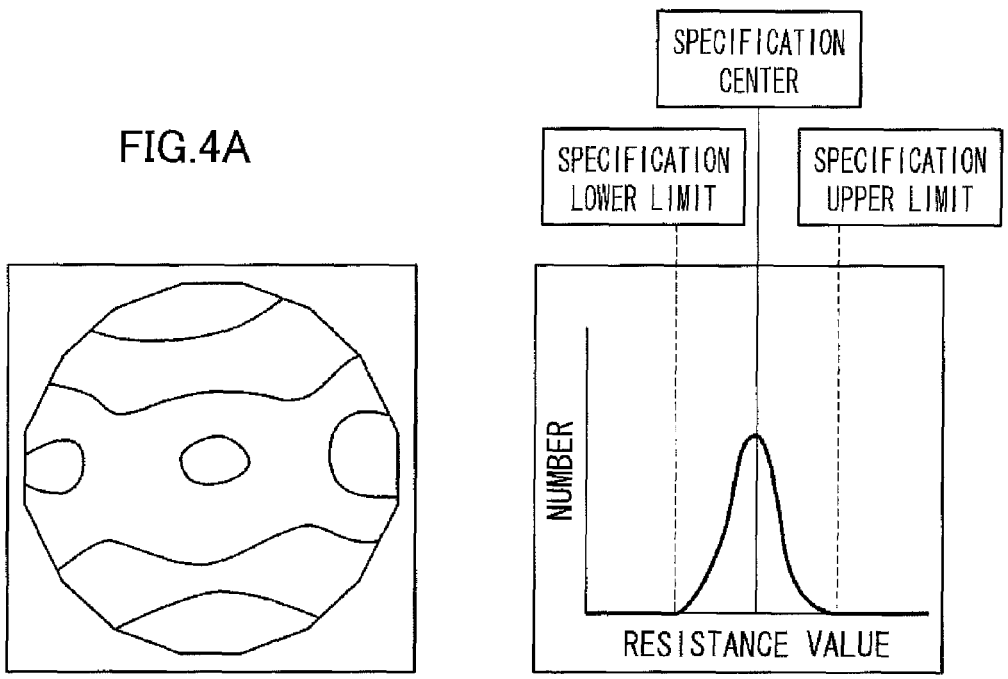

METHOD FOR MANUFACTURING ELECTRIC FILM BODY

CROSS-REFERENCE TO RELATED APPLICATION

This application claims, under USCC 119, priority of Japanese Application No. 2012-198813 filed on Sep. 10, 2012.

BACKGROUND OF THE INVENTION

1. Technical Field Relating to the Invention

The present invention relates to a method for manufacturing an electric film body made by forming a film body to have a shape and a size in accordance with desired electric characteristics.

2. Description of Related Art

In recent years, a resistor or the like is formed in a thin film shape along with a high density trend of a circuit of a wiring board. In addition, the wiring board is multilayered. Examples of this are a circuit board with a capacitor and a multilayered circuit board using the circuit board described in Patent Document 1 (Japanese Patent Laid-Open No. H08-125302) and an element-incorporated multilayered wiring board described in Patent Document 2 (Japanese patent Laid-Open No. 2003-17858).

The multilayered circuit board in Patent Document 1 is a circuit board with a capacitor in which a printed capacitor is formed on a surface of an insulating board. The printed capacitor includes a first electrode made of a copper foil on the surface of the insulating board, a dielectric layer made of a dielectric paste on the first electrode, and a second electrode made of a conductive paint on the dielectric layer.

The element-incorporated multilayered wiring board in Patent Document 2 includes a core base material having formed thereon a first wiring pattern, an insulating layer coated and formed on a side of a surface of the core base material having the first wiring pattern and provided with a closed-end hole for connection, and at least one incorporated element and a second wiring pattern not connected to the incorporated element formed on a surface of the insulating layer. The first and second wiring patterns are electrically connected via the closed-end hole for connection, and the incorporated element is not electrically or magnetically connected to at least any other incorporated element and is configured to enable independent adjustment of characteristics thereof.

In such a board, a wire or the like is formed in the following manner. Here, a thin-film resistor is described as an example of the wire or the like.

A resistor 1 is configured as shown in FIG. 1. A resistor thin film 2 is formed on an organic insulating layer in FIG. 1. This resistor thin film 2 is formed by a photolithographic method or the like. On both ends of the resistor thin film 2 are provided electrodes 4. The electrodes 4 are made of plating or the like.

A method for manufacturing this resistor 1 is shown in FIGS. 2A to 2E and 3. FIGS. 2A to 2E are schematic views showing a manufacturing process of the resistor 1. FIG. 3 is a flowchart showing the manufacturing process of the resistor 1. Hereinafter, the manufacturing process will be described based on FIGS. 2A to 2E while referring to the flowchart in FIG. 3 as needed.

First, as in FIG. 2A, a resistor thin film 7 is formed on the organic insulating layer 3 as a board layer (step S1). Subsequently, as in FIG. 2B, a photoresist layer 8 is formed by photolithography with use of predetermined line width data (line width data calculated theoretically) based on a targeted film thickness (film thickness target) (step S2).

Subsequently, as in FIG. 2C, the resistor thin film 7 is patterned by etching (step S3). Thereafter, as in FIG. 2D, the photoresist layer 8 is removed, and electrodes 9 are formed (step S4). Subsequently, as in FIG. 2E, probes 10 are brought into contact with the electrodes 9, and the electrodes have current applied thereto to measure voltage for confirmation of a resistance value (step S5).

Other wires and the like are formed in a similar manner.

SUMMARY OF THE INVENTION

However, in the aforementioned multilayered wiring board, even when a film is formed under predetermined apparatus conditions, and a pattern of a resistor or the like is formed to have a designed pattern width, variation may occur in characteristics (sheet resistances and the like) of a sputter film or the like for film formation. That is, when a surface state of an organic insulating layer as a foundation is non-uniform, or when a thickness of an insulating film varies, variation may occur in characteristics such as the sheet resistances.

In a case of forming a plurality of resistors, a goal is to form many thin-film resistors having resistance values at a specification center and within an allowable range (within a range from a specification upper limit to a specification lower limit) so that distribution of the resistance values may have less variation as in FIGS. 4A and 4B. However, in actual cases, when there are many thin-film resistors whose distribution of the resistance values is biased toward the specification lower limit side as in FIGS. 5A and 5B, or when there are many thin-film resistors whose distribution of the resistance values is biased toward the specification upper limit side as in FIGS. 6A and 6B, many thin-film resistors out of the specification may be produced.

Thus, in a conventional manufacturing method, when characteristics such as the sheet resistances vary, characteristics such as the resistance values of the resistors eventually formed vary by location in the board surface, and the resistance values cannot satisfy desired reference values.

In this case, for example, each resistance value needs to be adjusted by a trimming in which each of the formed thin-film resistors is irradiated with laser light to remove a part thereof. However, in a case where there are many thin-film resistors to be formed on the wiring board, or where variation in the resistance values is significant as described above, it requires time etc. to adjust the resistance values, which has an effect on manufacturing time and cost for the wiring board.

The present invention is accomplished by taking such problems as mentioned above into consideration thereof, and an object thereof is to provide a method for manufacturing an electric film body enabling to form an element with targeted characteristics in a short period of time, in an efficient manner, at low cost, and in high accuracy regardless of variation in distribution of characteristics such as resistance values.

A method for manufacturing an electric film body according to the present invention etc. is a method for manufacturing an electric film body made by forming a film body to have a shape in accordance with a desired electric characteristic and includes a film forming process for forming an electric film body on a board layer, an electric characteristic measuring process for measuring an electric characteristic in a surface of the electric film body formed in the film forming process, an electric film body shape setting process for setting a shape of the electric film body based on the electric characteristic measured in the electric characteristic measuring process, and an electric film body forming process for forming the electric film body formed in the shape set in the electric film body shape setting process.

With the method for manufacturing an electric film body according to the present invention, an element such as a thin-film resistor can be formed in a short period of time, in an efficient manner, and in high accuracy.

BRIEF DESCRIPTION OF DRAWINGS

FIG. 3 is a flowchart showing the manufacturing process of the conventional thin-film resistor.

FIGS. 4A and 4B are resistance value distribution and a graph showing a state in which there are many thin-film resistors having resistance values at a specification center and within an allowable range (within a range from a specification upper limit to a specification lower limit) so that distribution of the resistance values may have less variation.

DETAILED DESCRIPTION OF THE PREFERRED EMBODIMENTS

Hereinafter, a method for manufacturing an electric film body according to embodiments of the present invention will be described with reference to the attached drawings. The method for manufacturing an electric film body according to the embodiments can be applied to various thin-film forming methods, but will be described below, taking a photolithographic method as an example. In the photolithographic method, an exposure apparatus or the like baking an element and circuit pattern drawn on a photomask is used. First, photoresist is formed on an insulating layer by a spin coater or spraying and is exposed to light to bake the element and circuit pattern drawn on the photomask. Subsequently, unnecessary parts are removed by etching, and electrodes and the like are formed by plating. The method for manufacturing an electric film body according to the embodiments will be described with use of this photolithographic method. Hereinafter, a thin-film resistor will be described as an example of the electric film body.

First Embodiment

Figure 1:
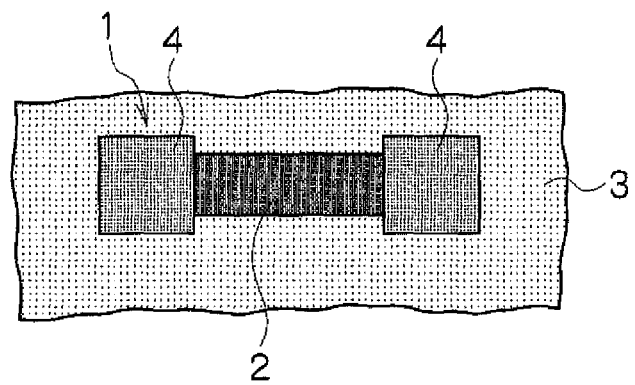
FIG. 1 is a top plan view showing a thin-film resistor.
Figure 2A:
FIGS. 2A to 2E are schematic views showing a manufacturing process of a conventional thin-film resistor.
Figure 2B:
Figure 2C:
Figure 2D:
Figure 2E:
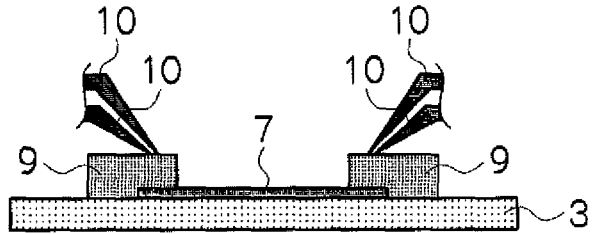
Figure 5A:
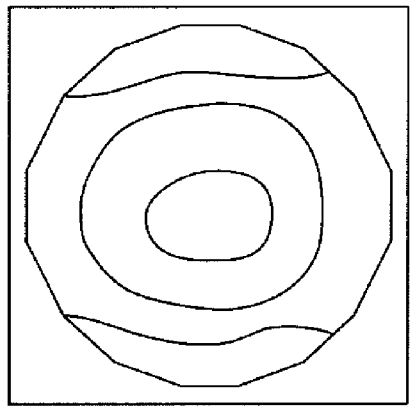
FIGS. 5A and 5B are resistance value distribution and a graph showing a state in which there are many thin-film resistors whose distribution of the resistance values is biased toward the specification lower limit side.
Figure 5B:
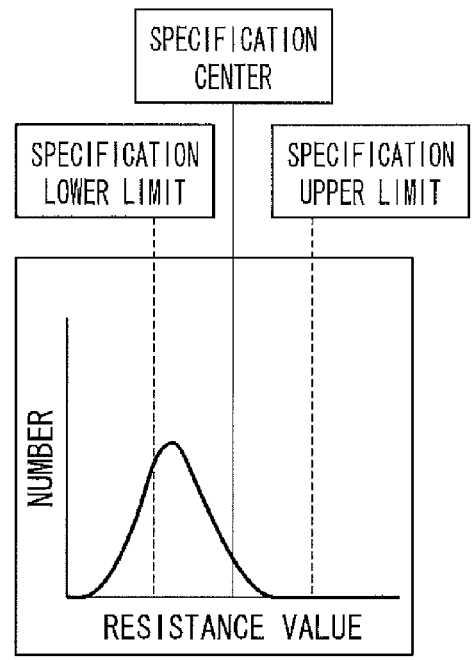
Figure 6A:
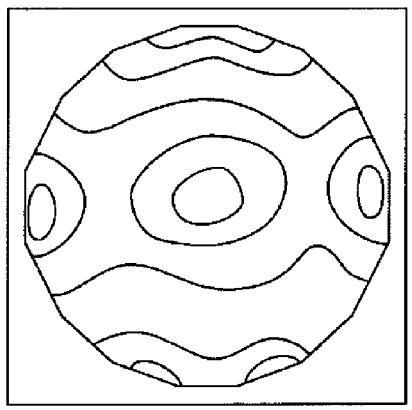
FIGS. 6A and 6B are resistance value distribution and a graph showing a state in which there are many thin-film resistors whose distribution of the resistance values is biased toward the specification upper limit side.
Figure 6B:
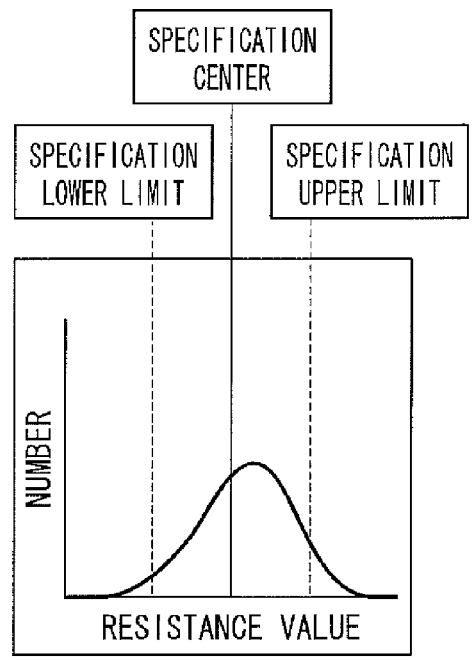
Figure 7A:
FIGS. 7A to 7I are schematic views showing a manufacturing process of a thin-film resistor according to an embodiment of the present invention.
Figure 7B:
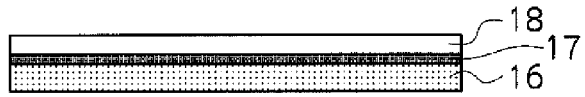

First, a first embodiment of the present invention will be described. A method for manufacturing a thin-film resistor according to the present embodiment is a method for forming a thin-film resistor by measuring resistance values in a thin-film surface to measure distribution of the resistance values in the thin-film surface and setting a shape of a thin-film body of a resistor based on the resistance values at respective resistor forming positions (electric film body forming positions). The method for manufacturing a resistor is shown in FIGS. 7A to 7I and 8. FIGS. 7A to 7I are schematic views showing a manufacturing process of a resistor. FIG. 8 is a flowchart showing the manufacturing process of the resistor. Hereinafter, the manufacturing process will be described based on FIGS. 7A to 7I while referring to the flowchart in FIG. 8 as needed.

The method for manufacturing a thin-film resistor according to the present embodiment includes a film forming process, an electric characteristic measuring process, a thin-film resistor shape setting process as an electric film body shape setting process, and a thin-film resistor forming process as an electric film body forming process.

The film forming process is a process for forming a thin film on a board layer. In the film forming process, as in FIG. 7A, a resistor thin film 17 is formed on an organic insulating layer 16 as a board layer (step S11). Examples of a base material for the resistor thin film 17 are Cr, NiP, NiCr, NiH, Ni, Ta, TaN, Ti, TiO, and an alloy material containing these. Methods for forming a thin film as a base material for a resistor are a sputtering method, a deposition method, a non-electrolytic plating method, an electrolytic plating method, a nanopaste coating method, and a combined method of these.

Subsequently, as in FIG. 7B, photoresist 18 is formed on an entire surface of an upper surface of the resistor thin film 17.

The electric characteristic measuring process is a process for measuring resistance values in a surface of the thin film formed in the aforementioned film forming process. In the electric characteristic measuring process, a pattern for measurement is formed near a resistor forming position of the resistor, and a resistance value of the resistor near the resistor forming position is directly measured.

Figure 7C:
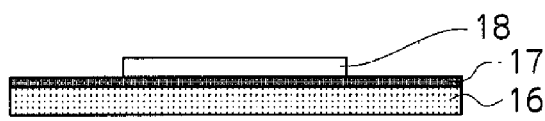
Figure 8:
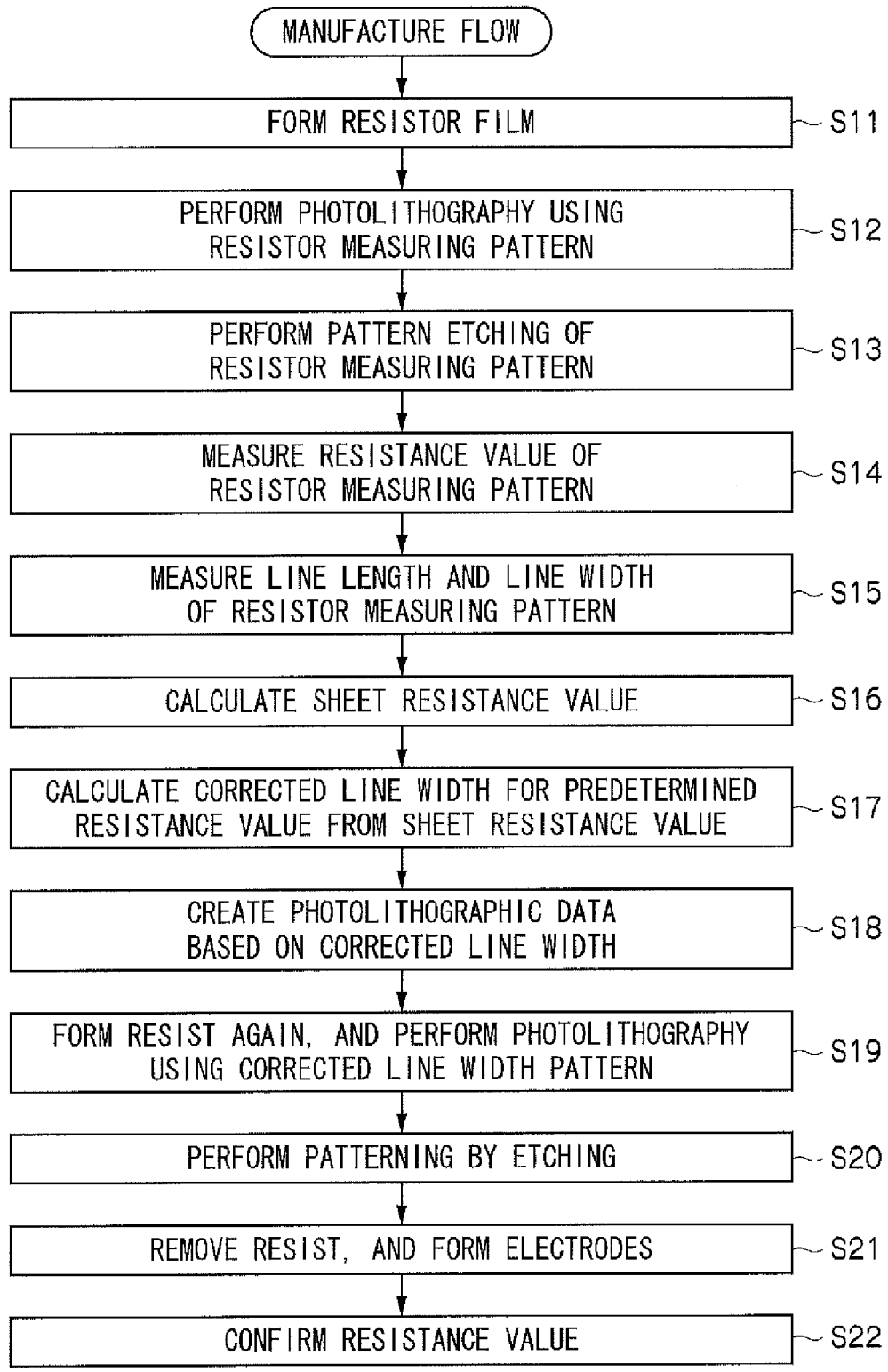
FIG. 8 is a flowchart showing the manufacturing process of the thin-film resistor according to the embodiment of the present invention.

Specifically, as in FIG. 7C, the resistor measuring pattern is arbitrarily set, and the photoresist 18 is formed to match the resistor measuring pattern by photolithography (step S12).

Subsequently, as in FIG. 7D, the resistor thin film 17 is formed to match the resistor measuring pattern by pattern etching (step S13) and a resistor 19 (see FIG. 7E) is formed by removing the photoresist 18.

Subsequently, as in FIG. 7E, probes 20 are brought into contact with the resistor 19 to measure a resistance value of the resistor measuring pattern by current application and voltage measurement (step S14). Also, a line length and a line width of this resistor measuring pattern are measured (step S15).

Subsequently, the procedure goes to the thin-film resistor shape setting process. The thin-film resistor shape setting process is a process for setting a shape of the thin-film resistor based on the resistance value measured in the aforementioned electric characteristic measuring process. A sheet resistance value is calculated from the result of measuring the resistor measuring pattern to set the shape of the thin-film resistor.

Specifically, the sheet resistance value of the forming position of the thin-film resistor is calculated from the resistance value, the line length, and the line width of the resistor measuring pattern (step S16). The line length and the line width of the resistor measuring pattern are corrected by this sheet resistance value, and a line length and a line width of the resistor are calculated so that a predetermined resistance value can be obtained (step S17). Meanwhile, in a case where a length of the resistor is determined in advance, only a line width is calculated.

Subsequently, a dimension and a shape of the resistor are set based on the aforementioned corrected line length and corrected line width, and photolithographic data is created based on the dimension and the shape of the resistor (step S18).

Subsequently, the procedure goes to the thin-film resistor forming process. The thin-film resistor forming process is a process for forming a thin-film resistor formed in the shape set in the aforementioned thin-film resistor shape setting process. In this thin-film resistor forming process, first, as in FIG. 7F, the photoresist 18 is formed on the entire surface of the upper surface of the resistor thin film 17 again to form the photoresist 18 formed in the shape of the resistor (step S19). That is, the photoresist 18 formed in the shape of the resistor is formed by photolithography with use of pattern data for the corrected line length and the corrected line width based on the aforementioned photolithographic data created based on the dimension and the shape of the resistor.

Subsequently, as in FIG. 7G, the resistor thin film 17 is patterned by etching (step S20). Thereafter, as in FIG. 7H, the photoresist 18 is removed, and electrodes 21 are formed (step S21). As in FIG. 7I, probes 20 are brought into contact with the electrodes 21, and the electrodes 21 have current applied thereto to measure voltage for confirmation of a resistance value (step S22).

In the above described manner, variation in distribution of resistance values of the resistor thin film is absorbed, and a thin-film resistor 22 having a set resistance value can be formed on the resistor thin film 17 in a short period of time, in an efficient manner, and in high accuracy.

Second Embodiment

Next, a second embodiment of the present invention will be described. A method for manufacturing an electric film body according to the present embodiment is a method for manufacturing multiple thin-film resistors at a time.

After the resistor thin film 17 is formed on the entire surface on the organic insulating layer, distribution of thin film sheet resistances over an entire area in the board surface is measured, and the in-plane distribution is reflected on photolithography data for patterning of resistors. Specifically, a line length and a line width of each resistor are adjusted at each resistor forming position in the board surface so that each resistor having a desired resistance value can be formed in accordance with the in-plane distribution of the sheet resistance values. By doing so, variation in resistance values of the respective resistors can be wholly absorbed on the entire surface of the board, and high-accuracy resistors with less variation can be obtained efficiently. Also, multiple resistors can be obtained at a time.

The method for manufacturing an electric film body according to the present embodiment is one in which the method for manufacturing an electric film body according to the first embodiment has been applied to multiple resistors. Specifically, the method for manufacturing an electric film body according to the present embodiment includes a film forming process for forming a thin film on an entire surface of a board layer, an electric characteristic measuring process for measuring resistance values over an entire area of a surface of the thin film formed in the film forming process, an electric film body shape setting process for setting shapes of thin-film bodies in accordance with the resistance values at respective resistor forming positions in the thin film measured in the electric characteristic measuring process, and a thin-film body forming process for forming thin-film resistors formed in the shapes set in accordance with the respective resistor forming positions in the electric film body shape setting process.

The method for manufacturing an electric film body according to the present embodiment will be described based on FIGS. 9 to 13. In description of the present embodiment as well, a resistor is used as a thin-film body. It is to be noted that individual processes and a configuration of a resistor are similar to those of the resistor 22 in the first embodiment, and thus similar or identical components to those in the first embodiment are shown with the same reference numerals, and description of the duplicate components is omitted. Hereinafter, a case of manufacturing 18 resistors 22 separated into nine blocks at a time will be described as an example.

Figure 9:
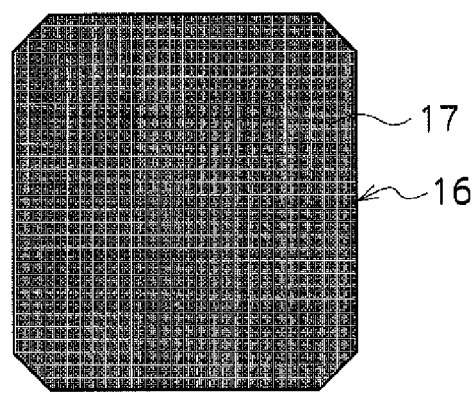
FIG. 9 is a top plan view showing a state of forming a resistor thin film and photoresist on an organic insulating layer.

FIG. 9 shows a state of forming the resistor thin film 17 and the photoresist 18 on the organic insulating layer 16 in a similar manner to FIG. 7B.

Figure 7D:
Figure 7E:
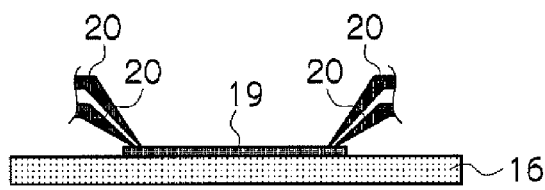
Figure 10:
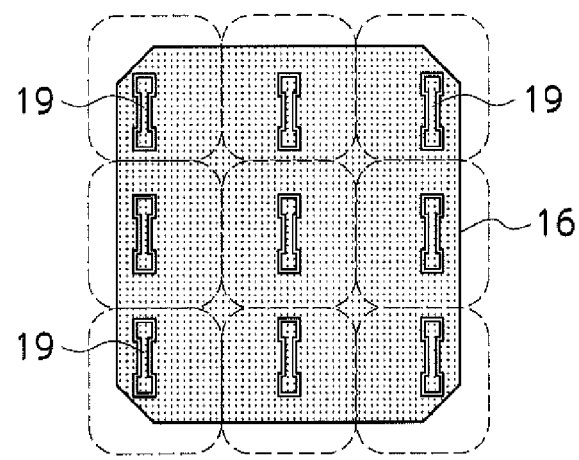
FIG. 10 is a top plan view showing a state of separating the resistor thin film into nine blocks, forming the photoresist for the respective blocks, and forming the resistor thin film for the respective blocks.

FIG. 10 shows a state of separating the resistor thin film 17 into nine blocks, forming the photoresist 18 as in FIG. 7C for the respective blocks, and forming the resistor thin film 17 as in FIG. 7D for the respective blocks. Thus, nine resistor measuring patterns are formed for the respective blocks. Subsequently, resistance values of the nine resistor measuring patterns are calculated to measure distribution of sheet resistance values over an entire area of the resistor thin film 17. Shapes of resistors are then set based on the sheet resistance values at respective resistor forming positions (nine resistor forming positions).

Figure 7F:
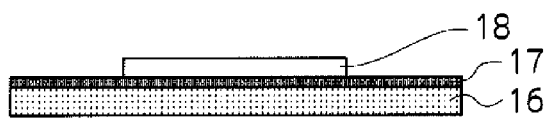
Figure 11:
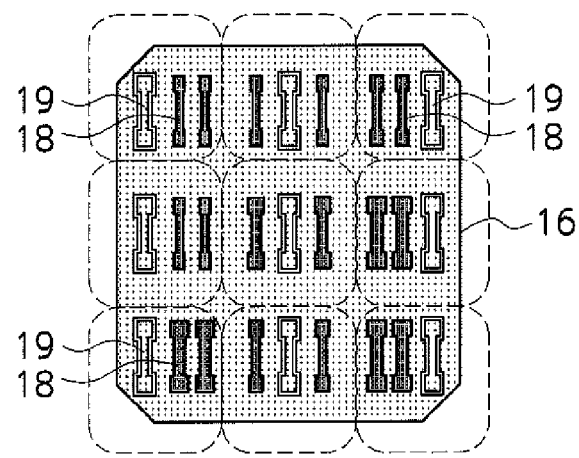
FIG. 11 is a top plan view showing a state of forming the photoresist to match shapes of resistors set based on sheet resistance values at nine thin-film resistor forming positions.

FIG. 11 shows a state of forming the photoresist 18 to match the shapes of the resistors set based on the sheet resistance values at the respective resistor forming positions (the nine resistor forming positions) as in FIG. 7F. At this time, since the respective sheet resistance values measured at the nine resistor forming positions on an upper surface of the resistor thin film 17 differ by variation in distribution, shapes of the photoresist 18 differ by the nine resistor forming positions.

Figure 7G:
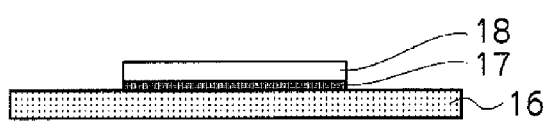
Figure 12:
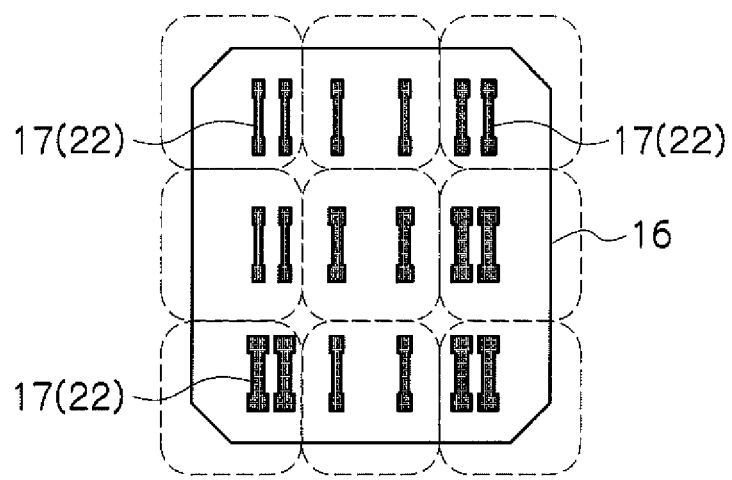
FIG. 12 is a top plan view showing a state of patterning the resistor thin film by etching.

FIG. 12 shows a state of patterning the resistor thin film 17 by etching as in FIG. 7G. Thus, different resistor thin films 17 (resistors 22) by the nine resistor forming positions are formed.

Figure 7H:
Figure 7I:
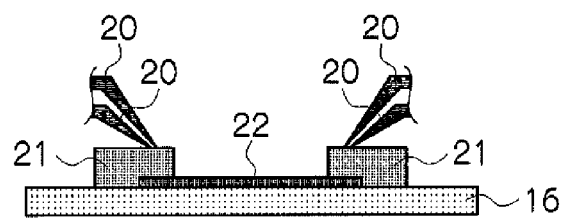
Figure 13:
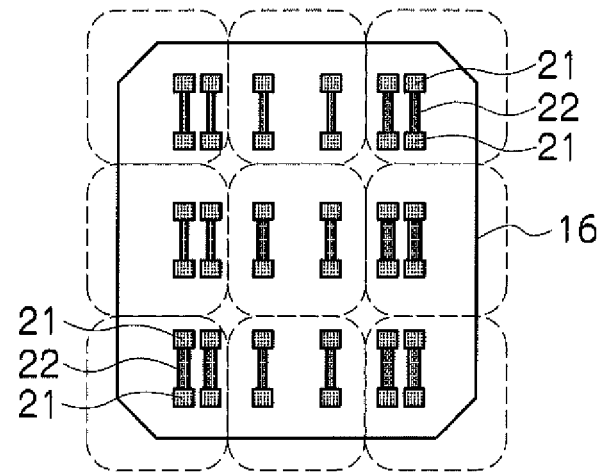
FIG. 13 is a top plan view showing a state of forming electrodes.

FIG. 13 shows a state of forming the electrodes 21 as in FIG. 7H. Thereafter, as in FIG. 7I, the probes 20 are brought into contact with the electrodes 21, and the electrodes 21 have current applied thereto to measure voltage for confirmation of resistance values.

Accordingly, adjustment of resistance values of multiple resistors 22 can be performed efficiently in a short period of time, and the resistors 22 having more precise resistance values can be formed.

Additionally, by increasing the number of sheet resistance value measuring patterns (the number of blocks) to be arranged in the board surface to narrow adjustment spaces, more precise resistance value adjustment can be performed.

MODIFICATION EXAMPLES

Although a resistor is manufactured as an electric film body in the aforementioned respective embodiments, the present invention can also be applied to manufacture of an electric film body such as an electrode of a thin-film capacitor (a thin-film condenser). In this case, an electric characteristic to be measured on an entire surface of the electric film body is capacitance or permittivity.

Also, as an exposure apparatus at the time of patterning in a photolithographic method, it is efficient to use a laser drawing apparatus to perform direct drawing on each board since an in-plane resistor pattern line width and the like differ per board. Also, in a case of a mask exposure apparatus using a glass mask or a film mask, a similar effect can be obtained by producing a mask reflecting a sheet resistance value of each board.

In the aforementioned respective embodiments, as a method for measuring a sheet resistance in a board surface, a method for forming a pattern for measurement having similar shape and structure to those of a resistor pattern and measuring a sheet resistance from the resistance value has been shown. However, other methods may be used. That is, a sheet resistance may be measured with use of a specific pattern for measurement of a sheet resistance such as a rectangular or cloverleaf pattern by a van der pauw method. Also, a sheet resistance measuring method with use of a four-probe method, without use of a test pattern, can also be used.

In the aforementioned respective embodiments, adjustment of a resistor line width has been shown. However, in a case where electrodes exist at an upper portion of a thin-film resistor, a method of changing sizes of the electrodes by adjusting photolithography data of the electrodes to resultingly adjust a resistor line length to obtain a desired resistance value is also effective. The resistor line length may be adjusted directly.

In the aforementioned respective embodiments, adjustment of a resistor line width has been shown. However, in a case where an organic insulating layer for stress relaxation and surface protection exists between a thin-film resistor and electrodes, a method of adjusting photolithography data of insulating openings, adjusting sizes of the organic insulating layer openings connecting the thin-film resistor to the electrodes, changing a distance between the openings to resultingly adjust a resistor line length to obtain a desired resistance value is also effective.

Also, the present invention is not limited to the aforementioned respective embodiments and respective modification examples but can be embodied in an embodiment phase by modifying components without departing from the spirit and scope of the present invention. Also, various inventions can be formed by arbitrary combination of a plurality of components disclosed in the aforementioned respective embodiments and respective modification examples.

The invention claimed is:

1. A method for manufacturing an electric film body made by forming a film body to have a shape in accordance with a desired electric characteristic, comprising:
 a film forming process for forming an electric film body on a board layer;
 an electric characteristic measuring process for measuring an electric characteristic by forming a measuring pattern in a surface of the electric film body formed in the film forming process and measuring an electric characteristic of the measuring pattern;
 an electric film body shape setting process for setting a shape of the electric film body based on the electric characteristic of the measuring pattern measured in the electric characteristic measuring process; and
 an electric film body forming process for forming the electric film body formed in the shape set in the electric film body shape setting process,
 wherein, in the film forming process, the electric film body on the board layer is formed on an entire surface of the board layer,
 wherein, in the electric characteristic measuring process, the electric characteristic of the measuring pattern is measured as the electric characteristic over an entire area in the electric film body,
 wherein, in the electric film body shape setting process, the electric film body formed in the shape set in accordance with the individual electric film body forming position is formed.

2. The method for manufacturing an electric film body according to claim 1, wherein the electric film body is a resistor, and the electric characteristic is a resistance value.

3. The method for manufacturing an electric film body according to claim 1, wherein the electric film body is an electrode of a capacitor, and the electric characteristic is capacitance or permittivity.

4. The method for manufacturing an electric film body according to claim 1, wherein a plurality of electric film bodies having the set shape are manufactured on the board layer at a time.

5. The method for manufacturing an electric film body according to claim 2, wherein a plurality of electric film bodies having the set shape are manufactured on the board layer at a time.

6. The method for manufacturing an electric film body according to claim 3, wherein a plurality of electric film bodies having the set shape are manufactured on the board layer at a time.

7. An electric film body made by forming a film body to have a shape in accordance with a desired electric characteristic, manufactured by a process comprising the steps of:
 forming a film for forming an electric film body on a board layer;
 measuring an electric characteristic by forming a measuring pattern in a surface of the electric film body formed in the film forming step and measuring an electric characteristic of the measuring pattern;
 setting a shape of the electric film body based on the electric characteristic of the measuring pattern measured in the electric characteristic measuring step; and
 forming the electric film body formed in the shape set in the electric film body shape setting step,
 wherein, in the film forming process, the electric film body on the board layer is formed on an entire surface of the board layer,
 wherein, in the electric characteristic measuring process, the electric characteristic of the measuring pattern is measured as the electric characteristic over an entire area in the electric film body,
 wherein, in the electric film body shape setting process, the electric film body formed in the shape set in accordance with the individual electric film body forming position is formed.

* * * * *